(12) United States Patent
Ibbetson et al.

(10) Patent No.: US 9,666,772 B2
(45) Date of Patent: May 30, 2017

(54) HIGH POWERED LIGHT EMITTER PACKAGES WITH COMPACT OPTICS

(75) Inventors: James Ibbetson, Santa Barbara, CA (US); Jayesh Bharathan, Cary, NC (US); Bernd Keller, Santa Barbara, CA (US)

(73) Assignee: CREE, INC., Goleta, CA (US)

( * ) Notice: Subject to any disclaimer, the term of this patent is extended or adjusted under 35 U.S.C. 154(b) by 0 days.

(21) Appl. No.: 10/836,743

(22) Filed: Apr. 29, 2004

(65) Prior Publication Data
US 2004/0227149 A1   Nov. 18, 2004

Related U.S. Application Data

(60) Provisional application No. 60/467,193, filed on Apr. 30, 2003.

(51) Int. Cl.
*H01L 33/54* (2010.01)
*H01L 33/60* (2010.01)
*H01L 33/64* (2010.01)
*H01L 33/56* (2010.01)
*H01L 33/58* (2010.01)

(52) U.S. Cl.
CPC ............ *H01L 33/54* (2013.01); *H01L 33/60* (2013.01); *H01L 33/641* (2013.01); *H01L 33/56* (2013.01); *H01L 33/58* (2013.01); *H01L 2224/48091* (2013.01); *H01L 2924/12044* (2013.01)

(58) Field of Classification Search
USPC .................................................. 257/99, 100
See application file for complete search history.

(56) References Cited

U.S. PATENT DOCUMENTS 4,346,275 A * 8/1982 Iwakiri et al. ............... 200/314
4,476,620 A * 10/1984 Ohki et al. ..................... 438/33
4,902,356 A   2/1990 Noguchi et al. ............. 148/33.4
(Continued)

FOREIGN PATENT DOCUMENTS

CN   2535926        2/2003
CN   1492521 A      4/2004
(Continued)

OTHER PUBLICATIONS

American Institute of Physics Handbook, Third Edition, McGraw-Hill, Ed.: Dwight E. Gray, 1972.*
(Continued)

*Primary Examiner* — Johannes P Mondt
(74) *Attorney, Agent, or Firm* — Koppel, Patrick, Heybl & Philpott

(57) ABSTRACT

A light emitter includes a planar supporting surface, a light source positioned on the spreader region, and an encapsulant positioned on the spreader region to surround the light source. Except where constrained by adhesion to the planar supporting surface, the encapsulant is capable of expanding and contracting in response to a change in temperature so that forces caused by differences in the coefficient of thermal expansion between the different components is minimized. One or more reflective elements can be positioned proximate to the light source to increase the light emitting efficiency of the light emitter. The reflective elements can include a reflective layer on the spreader region and/or a reflective layer on a portion of the encapsulant.

15 Claims, 3 Drawing Sheets

(56) References Cited

U.S. PATENT DOCUMENTS

| | | | |
|---|---|---|---|
| 4,912,532 A | 3/1990 | Cook et al. .................. 357/16 |
| 4,946,547 A | 8/1990 | Palmour et al. ............. 156/643 |
| 5,087,949 A | 2/1992 | Haitz et al. .................... 357/17 |
| 5,094,185 A | 3/1992 | Simopoulos et al. |
| 5,103,271 A | 4/1992 | Izumiya et al. ............... 357/17 |
| 5,200,022 A | 4/1993 | Kong et al. .................. 156/612 |
| 5,226,052 A * | 7/1993 | Tanaka et al. ................. 372/36 |
| 5,376,241 A | 12/1994 | Shor et al. ................. 204/129.3 |
| 5,376,580 A | 12/1994 | Kish et al. .................... 437/127 |
| RE34,861 E | 2/1995 | Davis et al. .................. 437/100 |
| 5,502,316 A | 3/1996 | Kish et al. ..................... 257/94 |
| 5,614,734 A | 3/1997 | Guido ............................ 257/94 |
| 5,644,156 A | 7/1997 | Suzuki et al. ................ 257/485 |
| 5,739,186 A * | 4/1998 | Hayakawa et al. .......... 523/443 |
| 5,803,579 A | 9/1998 | Turnbull et al. |
| 5,834,570 A * | 11/1998 | Kaji et al. .................... 525/481 |
| 5,847,507 A * | 12/1998 | Butterworth et al. ........ 313/512 |
| 5,851,449 A | 12/1998 | Uchino et al. ................. 264/1.7 |
| 5,939,732 A | 8/1999 | Kurtz et al. .................... 257/77 |
| 5,959,316 A | 9/1999 | Lowery ........................... 257/98 |
| 5,985,687 A | 11/1999 | Bowers et al. ................. 438/46 |
| 6,066,861 A | 5/2000 | Hohn et al. ..................... 257/99 |
| 6,071,795 A | 6/2000 | Cheung et al. ............... 438/458 |
| 6,091,084 A | 7/2000 | Fujii .............................. 257/82 |
| 6,132,072 A | 10/2000 | Turnbull et al. |
| 6,144,536 A | 11/2000 | Zimmerman et al. |
| 6,184,544 B1 * | 2/2001 | Toda .................... H01L 33/486 |
| | | 257/100 |
| 6,212,213 B1 | 4/2001 | Weber et al. |
| 6,222,207 B1 * | 4/2001 | Carter-Coman et al. ....... 257/98 |
| 6,225,647 B1 | 5/2001 | Kurtz et al. .................... 257/94 |
| 6,234,648 B1 | 5/2001 | Borner et al. |
| 6,258,699 B1 | 7/2001 | Chang et al. ................. 438/458 |
| 6,274,924 B1 | 8/2001 | Carey et al. .................. 257/676 |
| 6,303,405 B1 | 10/2001 | Yoshida et al. ................. 438/46 |
| 6,345,903 B1 | 2/2002 | Koike et al. .................. 362/249 |
| 6,346,771 B1 * | 2/2002 | Salam .......................... 313/499 |
| 6,350,041 B1 | 2/2002 | Tarsa et al. ................... 362/231 |
| 6,365,429 B1 | 4/2002 | Kneissl et al. .................. 438/46 |
| 6,375,340 B1 | 4/2002 | Biebl |
| 6,410,942 B1 | 6/2002 | Thibeault et al. .............. 257/88 |
| 6,420,199 B1 | 7/2002 | Coman et al. .................. 438/22 |
| 6,420,242 B1 | 7/2002 | Cheung et al. ............... 438/458 |
| 6,429,460 B1 | 8/2002 | Chen et al. ..................... 257/79 |
| 6,448,102 B1 | 9/2002 | Kneissl et al. .................. 438/46 |
| 6,465,809 B1 | 10/2002 | Furukawa et al. .............. 257/94 |
| 6,468,824 B2 | 10/2002 | Chen et al. ..................... 438/46 |
| 6,480,389 B1 | 11/2002 | Shie |
| 6,486,499 B1 | 11/2002 | Krames et al. .................. 257/81 |
| 6,489,637 B1 | 12/2002 | Sakamoto |
| 6,495,862 B1 | 12/2002 | Okazaki et al. .............. 257/103 |
| 6,513,949 B1 | 2/2003 | Marshall et al. |
| 6,538,371 B1 | 3/2003 | Duggal et al. |
| 6,550,949 B1 | 4/2003 | Bauer et al. |
| 6,552,495 B1 | 4/2003 | Chang |
| 6,559,075 B1 | 5/2003 | Kelly et al. ................... 438/795 |
| 6,562,648 B1 | 5/2003 | Wong et al. .................... 438/46 |
| 6,573,537 B1 | 6/2003 | Steigerwald et al. ........ 257/103 |
| 6,576,930 B2 | 6/2003 | Reeh et al. ..................... 257/98 |
| 6,577,073 B2 | 6/2003 | Shimizu et al. |
| 6,607,931 B2 | 8/2003 | Streubel ......................... 438/22 |
| 6,610,598 B2 | 8/2003 | Chen |
| 6,657,236 B1 | 12/2003 | Thibeault et al. .............. 257/98 |
| 6,677,173 B2 | 1/2004 | Ota ................................. 438/22 |
| 6,686,676 B2 | 2/2004 | McNulty et al. ............. 323/112 |
| 6,692,136 B2 | 2/2004 | Marshall et al. |
| 6,707,247 B2 | 3/2004 | Murano |
| 6,716,654 B2 | 4/2004 | Hsu et al. ....................... 438/22 |
| 6,734,467 B2 | 5/2004 | Schlereth et al. ............... 257/89 |
| 6,740,604 B2 | 5/2004 | Kelly et al. ................... 438/795 |
| 6,741,029 B2 | 5/2004 | Matsubara |
| 6,744,073 B1 * | 6/2004 | Nakata ............................ 257/81 |
| 6,757,314 B2 | 6/2004 | Kneissl et al. ................. 372/50 |
| 6,784,460 B2 | 8/2004 | Ng et al. ........................ 257/95 |
| 6,784,463 B2 | 8/2004 | Camras et al. |
| 6,786,390 B2 | 9/2004 | Yang et al. ................. 228/179.1 |
| 6,791,119 B2 | 9/2004 | Slater et al. .................... 257/99 |
| 6,791,259 B1 | 9/2004 | Stokes |
| 6,800,500 B2 | 10/2004 | Coman et al. .................. 438/22 |
| 6,806,112 B1 | 10/2004 | Horng et al. ................... 438/29 |
| 6,809,341 B2 | 10/2004 | Hsu et al. ....................... 257/79 |
| 6,809,347 B2 | 10/2004 | Tasch et al. |
| 6,817,735 B2 | 11/2004 | Shimizu et al. |
| 6,821,804 B2 | 11/2004 | Mack et al. .................... 438/29 |
| 6,841,804 B1 | 1/2005 | Chen et al. |
| 6,846,686 B2 | 1/2005 | Saeki et al. ..................... 438/22 |
| 6,849,878 B2 | 2/2005 | Bader et al. .................. 257/103 |
| 6,869,812 B1 | 3/2005 | Liu |
| 6,884,647 B2 | 4/2005 | Sakai et al. ..................... 438/30 |
| 6,914,267 B2 | 7/2005 | Fukasawa et al. |
| 6,936,855 B1 * | 8/2005 | Harrah ........................... 257/88 |
| 6,936,857 B2 | 8/2005 | Doxsee et al. |
| 6,953,255 B2 | 10/2005 | Horiuchi |
| 6,972,438 B2 | 12/2005 | Li et al. .......................... 257/98 |
| 7,005,679 B2 | 2/2006 | Tarsa et al. |
| 7,008,078 B2 | 3/2006 | Shimizu et al. |
| 7,009,199 B2 | 3/2006 | Hall ................................ 257/14 |
| 7,014,336 B1 | 3/2006 | Ducharme et al. |
| 7,015,511 B2 | 3/2006 | Sakai et al. ..................... 257/94 |
| 7,066,623 B2 | 6/2006 | Lee et al. |
| 7,066,626 B2 | 6/2006 | Omata |
| 7,091,653 B2 | 8/2006 | Ouderkirk et al. ........... 313/113 |
| 7,095,056 B2 | 8/2006 | Vitta et al. |
| 7,126,274 B2 | 10/2006 | Shimizu et al. .............. 313/512 |
| 7,132,691 B1 | 11/2006 | Tanabe et al. ................. 257/79 |
| 7,213,940 B1 | 5/2007 | Van De Ven et al. |
| 7,244,630 B2 | 7/2007 | Krames et al. ................. 438/47 |
| 7,258,816 B2 | 8/2007 | Tamaki et al. ......... 252/301.4 F |
| 7,364,338 B2 | 4/2008 | Chang .......................... 362/612 |
| 7,633,097 B2 | 12/2009 | Kim et al. |
| 7,649,209 B2 | 1/2010 | Hussell et al. ................. 257/98 |
| 7,869,483 B2 | 1/2011 | Uchida et al. ................. 372/99 |
| 8,067,254 B2 | 11/2011 | Camras et al. ................. 438/27 |
| 8,328,376 B2 | 12/2012 | Negley et al. |
| 8,896,197 B2 | 11/2014 | Negley ......................... 313/501 |
| 2001/0000622 A1 | 5/2001 | Reeh et al. ..................... 257/98 |
| 2001/0010449 A1 | 8/2001 | Chiu et al. |
| 2002/0001192 A1 * | 1/2002 | Suehiro et al. ............... 362/240 |
| 2002/0028527 A1 | 3/2002 | Maeda et al. |
| 2002/0070681 A1 | 6/2002 | Shimizu et al. .............. 315/246 |
| 2002/0123164 A1 | 9/2002 | Slater et al. .................... 438/39 |
| 2002/0139990 A1 * | 10/2002 | Suehiro et al. ................. 257/99 |
| 2002/0140880 A1 | 10/2002 | Weindorf et al. ............... 349/70 |
| 2002/0153835 A1 * | 10/2002 | Fujiwara et al. ............. 313/512 |
| 2002/0163302 A1 * | 11/2002 | Nitta et al. .................... 313/512 |
| 2002/0180351 A1 | 12/2002 | McNulty |
| 2002/0185966 A1 * | 12/2002 | Murano ........................ 313/501 |
| 2003/0025449 A1 | 2/2003 | Rossner |
| 2003/0030063 A1 | 2/2003 | Sosniak et al. ................. 257/89 |
| 2003/0067761 A1 | 4/2003 | Horiuchi et al. |
| 2003/0124752 A1 | 7/2003 | Wei et al. |
| 2003/0146411 A1 | 8/2003 | Srivastava et al. |
| 2003/0151361 A1 | 8/2003 | Ishizaka |
| 2003/0168670 A1 | 9/2003 | Roberts et al. ................. 257/98 |
| 2003/0173602 A1 | 9/2003 | Hsu et al. |
| 2003/0209714 A1 | 11/2003 | Taskar et al. |
| 2003/0230751 A1 | 12/2003 | Harada |
| 2004/0070004 A1 | 4/2004 | Eliashevich et al. |
| 2004/0072382 A1 | 4/2004 | Kelly et al. |
| 2004/0105261 A1 | 6/2004 | Ducharme et al. |
| 2004/0119083 A1 | 6/2004 | Su et al. ......................... 257/98 |
| 2004/0144987 A1 | 7/2004 | Ouderkirk et al. ............. 257/98 |
| 2004/0188697 A1 * | 9/2004 | Brunner et al. ................ 257/99 |
| 2004/0207999 A1 * | 10/2004 | Suehiro .................. G02B 6/0018 |
| | | 362/84 |
| 2004/0212998 A1 | 10/2004 | Mohacsi |
| 2004/0217364 A1 | 11/2004 | Tarsa et al. |
| 2004/0222435 A1 | 11/2004 | Shimizu et al. .............. 257/100 |
| 2004/0239243 A1 | 12/2004 | Roberts et al. ............... 313/512 |
| 2004/0245543 A1 | 12/2004 | Yoo ............................... 257/103 |
| 2004/0264185 A1 * | 12/2004 | Grotsch ................... H01L 33/58 |
| | | 362/231 |
| 2005/0077531 A1 | 4/2005 | Kim |
| 2005/0082562 A1 | 4/2005 | Ou et al. ....................... 257/103 |

(56) References Cited

U.S. PATENT DOCUMENTS

| | | | |
|---|---|---|---|
| 2005/0082974 A1 | 4/2005 | Fukasawa et al. | |
| 2005/0104080 A1 | 5/2005 | Ichihara et al. | |
| 2005/0121688 A1 | 6/2005 | Nagai et al. | |
| 2005/0184298 A1 | 8/2005 | Ueda | 257/79 |
| 2005/0205974 A1 | 9/2005 | Su et al. | |
| 2005/0221519 A1 | 10/2005 | Leung et al. | 438/27 |
| 2005/0224821 A1 | 10/2005 | Sakano | |
| 2005/0227379 A1 | 10/2005 | Donofrio | |
| 2005/0242364 A1 | 11/2005 | Moustakas et al. | 257/103 |
| 2005/0248271 A1 | 11/2005 | Ng et al. | |
| 2005/0253158 A1 | 11/2005 | Yasukawa et al. | 257/98 |
| 2006/0002101 A1 | 1/2006 | Wheatley et al. | |
| 2006/0011935 A1 | 1/2006 | Krames et al. | 257/99 |
| 2006/0012989 A1 | 1/2006 | Lee | |
| 2006/0060888 A1 | 3/2006 | Kim et al. | |
| 2006/0063289 A1 | 3/2006 | Negley | |
| 2006/0105482 A1 | 5/2006 | Alferink et al. | |
| 2006/0105485 A1 | 5/2006 | Basin et al. | 438/27 |
| 2006/0145170 A1 | 7/2006 | Cho | |
| 2006/0154392 A1 | 7/2006 | Tran et al. | |
| 2006/0255341 A1 | 11/2006 | Pinnington et al. | 257/79 |
| 2006/0273335 A1 | 12/2006 | Asahara | |
| 2006/0284207 A1 | 12/2006 | Park et al. | 257/99 |
| 2007/0057271 A1 | 3/2007 | Schiaffino et al. | |
| 2007/0080337 A1 | 4/2007 | Sorg | 257/13 |
| 2007/0200127 A1 | 8/2007 | Andrews et al. | |
| 2007/0215890 A1 | 9/2007 | Harbers et al. | |
| 2007/0262338 A1 | 11/2007 | Higashi et al. | |
| 2007/0262339 A1 | 11/2007 | Hussell | 257/99 |
| 2008/0042151 A1 | 2/2008 | Oh et al. | 257/88 |
| 2008/0048200 A1 | 2/2008 | Mueller et al. | |
| 2008/0217635 A1 | 9/2008 | Emerson | |
| 2008/0315228 A1 | 12/2008 | Krames et al. | 257/98 |
| 2009/0173958 A1 | 7/2009 | Chakraborty et al. | 257/98 |
| 2009/0278148 A1 | 11/2009 | Nabekura et al. | 257/98 |
| 2011/0018013 A1 | 1/2011 | Margalith et al. | 257/91 |
| 2011/0132521 A1 | 6/2011 | Paolini et al. | 156/67 |
| 2012/0132937 A1 | 5/2012 | Chang | 257/89 |

FOREIGN PATENT DOCUMENTS

| | | | |
|---|---|---|---|
| CN | 1624944 | 6/2005 | |
| CN | 101366126 | 2/2009 | |
| CN | 101405646 | 4/2009 | |
| CN | 101553936 | 10/2009 | |
| CN | 101636851 | 1/2010 | |
| EP | 0684648 | 11/1995 | |
| EP | 1156020 | 11/1995 | |
| EP | 1059667 | 12/2000 | |
| EP | 1059667 A2 | 12/2000 | |
| EP | 1059667 A2 * | 12/2000 | H01L 25/075 |
| EP | 1059678 A2 | 12/2000 | |
| EP | 1 156 020 A1 * | 11/2001 | |
| EP | 1168902 A2 * | 1/2002 | H05K 5/00 |
| EP | 1168902 A2 | 1/2002 | H05K 5/00 |
| EP | 1174930 A1 * | 1/2002 | H01L 33/00 |
| EP | 1246266 | 10/2002 | |
| EP | 1263058 A | 12/2002 | |
| EP | 1345275 A | 9/2003 | |
| EP | 1641049 A1 | 3/2006 | |
| GB | 1376086 * | 12/1974 | |
| GB | 2282700 A * | 4/1995 | F21V 7/00 |
| GB | 2282700 A | 4/1995 | |
| JP | 5371375 | 11/1951 | |
| JP | S508494 | 1/1975 | |
| JP | S0106175 | 6/1985 | |
| JP | 61032483 | 2/1986 | |
| JP | 6194362 | 6/1986 | |
| JP | S61144890 | 7/1986 | |
| JP | 6214481 | 1/1987 | |
| JP | 62143942 | 9/1987 | |
| JP | 646038 | 1/1989 | |
| JP | 01230274 | 9/1989 | |
| JP | H01139664 | 9/1989 | |
| JP | 01287973 | 11/1989 | |
| JP | 03035568 | 2/1991 | |
| JP | 03187229 | 8/1991 | |
| JP | 04028269 * | 1/1992 | H01L 33/00 |
| JP | 440555 | 4/1992 | |
| JP | 04313281 | 11/1992 | |
| JP | 05327012 | 12/1993 | |
| JP | 06104463 | 4/1994 | |
| JP | H06177427 | 6/1994 | |
| JP | 06275866 | 9/1994 | |
| JP | 07007180 | 1/1995 | |
| JP | 08213660 | 8/1996 | |
| JP | 8314395 | 11/1996 | |
| JP | 09083018 | 3/1997 | |
| JP | H09138402 | 5/1997 | |
| JP | 09-153646 | 6/1997 | |
| JP | 09181359 | 7/1997 | |
| JP | 10012929 A | 1/1998 | |
| JP | 10-163535 | 6/1998 | |
| JP | 10190065 | 7/1998 | |
| JP | H10190065 | 7/1998 | |
| JP | 10233532 | 9/1998 | |
| JP | 10312990 | 11/1998 | |
| JP | 11026808 | 1/1999 | |
| JP | H11177129 | 7/1999 | |
| JP | 11220178 A * | 8/1999 | H01L 33/00 |
| JP | 11284234 | 10/1999 | |
| JP | 11307325 A * | 11/1999 | H01C 17/30 |
| JP | 2000315826 | 11/2000 | |
| JP | 2000-353826 | 12/2000 | |
| JP | 2000353826 A | 12/2000 | |
| JP | 2001000043 | 1/2001 | |
| JP | 2001177153 | 6/2001 | |
| JP | 2001203396 | 7/2001 | |
| JP | 2001217467 | 8/2001 | |
| JP | 2001223388 A * | 8/2001 | H01L 33/00 |
| JP | 2002076443 | 3/2002 | |
| JP | 2002100609 | 4/2002 | |
| JP | 2002111065 | 4/2002 | |
| JP | 2002141556 | 5/2002 | |
| JP | 2002203989 | 7/2002 | |
| JP | 2002520823 | 7/2002 | |
| JP | 2002217450 | 8/2002 | |
| JP | 2002270515 | 8/2002 | |
| JP | 2002261333 | 9/2002 | |
| JP | 2002270515 | 9/2002 | |
| JP | 2002-299699 | 10/2002 | |
| JP | 2002289923 | 10/2002 | |
| JP | 2002299699 A | 10/2002 | |
| JP | U3091911 | 11/2002 | |
| JP | 2002353497 | 12/2002 | |
| JP | 2002353516 | 12/2002 | |
| JP | 2002368286 | 12/2002 | |
| JP | 20022368277 | 12/2002 | |
| JP | 2003017756 | 1/2003 | |
| JP | 2003036707 | 2/2003 | |
| JP | 2003037297 | 2/2003 | |
| JP | 2003046117 | 2/2003 | |
| JP | 2003046140 | 2/2003 | |
| JP | 2003046141 | 2/2003 | |
| JP | 2003-124522 | 4/2003 | |
| JP | 2003110146 | 4/2003 | |
| JP | 2003115204 | 4/2003 | |
| JP | 2003124524 | 4/2003 | |
| JP | 2003-515956 | 5/2003 | |
| JP | 2003533030 | 5/2003 | |
| JP | 2003174191 | 6/2003 | |
| JP | 2003209283 | 7/2003 | |
| JP | 2003218383 | 7/2003 | |
| JP | 2003234509 | 8/2003 | |
| JP | 2003234509 A | 8/2003 | |
| JP | 2003258296 | 8/2003 | |
| JP | WO03065464 A1 | 8/2003 | |
| JP | 2003-529889 | 10/2003 | |
| JP | 2003533030 | 11/2003 | |
| JP | 2003347601 | 12/2003 | |
| JP | 2004-031856 | 1/2004 | |
| JP | 2004031856 | 1/2004 | |
| JP | 2004505434 | 2/2004 | |
| JP | 2004-080046 | 3/2004 | |

(56) References Cited

FOREIGN PATENT DOCUMENTS

| | | |
|---|---|---|
| JP | 2004071357 | 3/2004 |
| JP | 2004-103443 | 4/2004 |
| JP | 2004119839 | 4/2004 |
| JP | 2004511080 | 4/2004 |
| JP | CN1492521 A | 4/2004 |
| JP | 2004152808 | 5/2004 |
| JP | 2004238441 | 8/2004 |
| JP | 2004266124 | 9/2004 |
| JP | 2005266124 | 9/2004 |
| JP | 2004-356116 | 12/2004 |
| JP | 2004363343 | 12/2004 |
| JP | 2004363537 | 12/2004 |
| JP | 20055433 | 1/2005 |
| JP | 2005026276 | 1/2005 |
| JP | 2005045199 | 2/2005 |
| JP | 2005050838 | 2/2005 |
| JP | 2005077089 | 3/2005 |
| JP | 2005109212 | 4/2005 |
| JP | 2005123238 | 5/2005 |
| JP | 2005-142311 | 6/2005 |
| JP | 2005166937 | 6/2005 |
| JP | 2005166941 | 6/2005 |
| JP | 2005167079 | 6/2005 |
| JP | 2005175389 | 6/2005 |
| JP | 2005-191514 | 7/2005 |
| JP | 2005191192 | 7/2005 |
| JP | 2005191414 | 7/2005 |
| JP | 2005191514 | 7/2005 |
| JP | 2005209852 | 8/2005 |
| JP | 2005244152 | 9/2005 |
| JP | 2005294736 A | 10/2005 |
| JP | 2005303012 | 10/2005 |
| JP | 2005303211 | 10/2005 |
| JP | 2005303211 A | 10/2005 |
| JP | 2005340750 | 12/2005 |
| JP | 2005353816 | 12/2005 |
| JP | 2006-049799 | 2/2006 |
| JP | 2006036930 | 2/2006 |
| JP | 2006086254 | 3/2006 |
| JP | 2006114909 | 4/2006 |
| JP | 2006191103 | 7/2006 |
| JP | 2006216717 | 8/2006 |
| JP | 2006229109 | 8/2006 |
| JP | 2006278675 | 10/2006 |
| JP | 2006339362 | 12/2006 |
| JP | 2006352061 | 12/2006 |
| JP | 2007005091 | 1/2007 |
| JP | 2007080885 | 3/2007 |
| JP | 2007110053 | 4/2007 |
| JP | 2007150331 | 6/2007 |
| JP | 2007180430 | 7/2007 |
| JP | 2007227679 | 9/2007 |
| JP | 2007273763 | 10/2007 |
| JP | 2007300106 | 11/2007 |
| JP | 2007300106 A | 11/2007 |
| JP | 2008514028 A | 5/2008 |
| JP | 2008514030 A | 5/2008 |
| JP | 2008300562 | 12/2008 |
| JP | 2009527913 | 7/2009 |
| JP | 2008514030 A5 | 1/2012 |
| KR | 2002-77135 | 10/2002 |
| KR | 20040087950 | 10/2004 |
| TW | 400438 | 8/2000 |
| TW | 506145 | 10/2002 |
| TW | 536842 | 6/2003 |
| TW | 546859 | 8/2003 |
| TW | M277882 U | 10/2005 |
| WO | WO 83/00408 A1 | 2/1983 |
| WO | WO 01/41225 A2 | 6/2001 |
| WO | WO-02/35612 A1 * | 5/2002 | ........... H01L 31/042 |
| WO | WO02061847 | 8/2002 |
| WO | WO 03/005458 A1 * | 1/2003 | ............ H01L 33/00 |
| WO | WO03005458 A1 | 1/2003 |
| WO | WO03010832 | 2/2003 |
| WO | WO03065464 | 8/2003 |
| WO | WO03065464 A1 | 8/2003 |
| WO | WO2004/100279 | 11/2004 |
| WO | WO2005031882 | 4/2005 |
| WO | WO2005048361 A2 | 5/2005 |
| WO | WO2005112137 | 11/2005 |
| WO | WO2005112137 A1 | 11/2005 |
| WO | WO 2005/124877 A2 | 12/2005 |
| WO | WO2006028312 A1 | 3/2006 |
| WO | WO2006035664 A | 4/2006 |
| WO | WO2006036565 | 4/2006 |
| WO | WO2006036565 A2 | 4/2006 |
| WO | WO2006036582 | 4/2006 |
| WO | WO2006036582 A1 | 4/2006 |
| WO | WO 2006/099741 A1 | 9/2006 |
| WO | WO2006099741 | 9/2006 |
| WO | WO20060999741 | 9/2006 |
| WO | WO 2007/063460 A1 | 6/2007 |
| WO | WO2007063460 A1 | 6/2007 |
| WO | WO 2007/141763 A1 | 12/2007 |
| WO | WO 2009/039805 A1 | 4/2009 |

OTHER PUBLICATIONS

"Thermal Conductivity of Metals as a Function of Temperature"—CRC Handbook of Chemistry and Physics, 89th Ed., 2008-2009, pp. 12-198 and 12-199. Ed. in Chief: David R. Lide.*

Translation from Japanese to English of Kaizu, M. (JP-(H)04-(0)28269), "Mounting Structure for an LED Bare Chip", published Jan. 30, 1992; prepared by the Translations Branch at the U.S. Patent and Trademark Office.*

Computerized translation from AINP (JPO) of Hashimoto et al, "Light-emitting device and Method of Manufacturing the same", (JP2003-046140), (Feb. 14, 2003) submitted as Office appendix.*

Windisch et al., *Impact of Texture-Enhanced Transmission on High-Efficiency Surface-Textured Light-Emitting Diodes*, Applied Physics Letters, vol. 79, No. 15, Oct. 8, 2001, pp. 2315-2317.

Schnitzer et al., *30% External Quantum Efficiency From Surface Textured, Thin-Film Light-Emitting Diodes*, Applied Physics Lett. 63(16), Oct. 18, 1993, pp. 2174-2176.

Windisch et al., *Light-Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.

Streubel et al., *High Brightness AlGaInP Light-Emitting Diodes*. IEEE Journal on Selected Topics in Quantum Electronics, vol. 8, No. 2, Mar./Apr. 2002, pp. 321-332.

Shor et al., *Direct Observation of Porous SiC Formed by Anodization in HF*, Appl. Phys. Lett. 62(22), May 31, 1993, pp. 2836-2838.

Windisch et al., *40% Efficient Thin-Film Surface-Textured Light-Emitting Diodes by Optimization of Natural Lithography*, IEEE Transactions on Electron Devices, vol. 47, No. 7, Jul. 7, 2000. pp. 1492-1498.

Windisch et al., *Non-Resonant Cavity Light-Emitting Diodes*, In Light-Emitting Diodes: Research, Manufacturing, and Applications 1V, H. Walter Yao et al., Proceedings of SPIE vol. 3938 (2000), pp. 70-76.

Zangooie et al., *Surface, Pore Morphology, and Optical Properties of Porous 4H-SiC*, Journal of the Electrochemical Society, 148(6) G297-G302 (2001) Jan. 9, 2001.

Mimura et al, *Blue Electroluminescence From Porous Silicon Carbide*, Appl. Phys. Lett 65(26), Dec. 26, 1994, pp. 3350-3352.

Khan F. A. et al, "High Rate Etching of SiC Using Inductively Coupled Plasma Reactive Ion Etching in SF6-Based Gas Mixtures", Applied Physics Letters, AIP, American Institute of Physics, Melville, NY, US, vol. 75, No. 15, Oct. 11, 1999 pp. 2268-2270.

Palmour J W et al., "Crystallographic Etching Phenomenon During Plasma Etching of SiC (100) Thin Films in SF6", Journal of the Electrochemical Society, Electrochemical Society. Manchester, New Hampshire, U.S., vol. 136, No. 2, Feb. 1, 1989, pp. 491-495.

Kelner G. et al., "Plasma Etching of Beta-SiC", Journal of the Electrochemical Society, Electrochemical Society. Manchester, New Hampshire, U.S. vol. 134, No. 1, Jan. 1987, pp. 253-254.

Lagoubi, A. et al. "Conditioning of N-Silicon by Photoelectrochemical Etching for Photovoltaic Applications", Proc.

(56) References Cited

OTHER PUBLICATIONS of the 11$^{th}$ E.C. Photovoltaic Solar Energy Conference, Oct. 12, 1992-Oct. 16, 1992, pp. 250-253, XP008043956, pp. 252-253, Figure 8.
Journal of Modern Optics, vol. 52, No. 8, May 20, 2005, pp. 1155-1160, "Design and Fabrication of Omnidirectional Reflectors in the Visible Range", Weihua Lin et al.
Related Indian Patent Application No. 4867/DELNP/2005, first examination report dated: Apr. 4, 2008.
PCT International Preliminary Report, Date: Mar. 27, 2008, PCT/US05/20603.
U.S. Appl. No. 11/613,692, filed Dec. 20, 2006.
U.S. Appl. No. 11/614,180, filed Dec. 21, 2006.
U.S. Appl. No. 11/613,714, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 11/951,626, filed Dec. 6, 2007.
U.S. Appl. No. 12/117,122, filed May 8, 2008.
U.S. Appl. No. 12/117,131, filed May 8, 2008.
U.S. Appl. No. 12/117,136, filed May 8, 2008.
U.S. Appl. No. 11/947,323, filed Nov. 29, 2007.
U.S. Appl. No. 12/035,604, filed Feb. 22, 2008.
U.S. Appl. No. 12/117,148, filed May 8, 2008.
U.S. Appl. No. 12/117,271, filed May 8, 2008.
U.S. Appl. No. 11/895,573, filed Aug. 24, 2007.
U.S. Appl. No. 11/835,044, filed Aug. 7, 2007.
U.S. Appl. No. 12/248,220, filed Oct. 9, 2008.
U.S. Appl. No. 12/277,745, filed Nov. 25, 2008.
"Cree® XLamp® 7090 XR-E Series LED Sinning and Labeling", Cree LED Light, Cree Inc. Application Note CLD-AP08.000, p. 1-7, (2006).
Official Notice of Rejection for counterpart Japanese Patent Application No. 2006-513442 dated Jun. 8, 2010.
From related application: European Office Action dated Dec. 12, 2009.
First Office Action from counterpart Chinese Patent Application No. 200910137491.3 mailed Apr. 14, 2010.
Office Action from U.S. Appl. No. 12/821,069, dated: Dec. 28, 2010.
Office Action from U.S. Appl. No. 12/002,429, dated: Jan. 28, 2011.
Office Action for German Patent Application No. 10 2008 029 318.0 dated mailed Dec. 13, 2010.
Extended European Search Report for counterpart European Patent Application No. 10185708.4 mailed Dec. 2, 2010.
Office Action for counterpart Korean Patent Application No. 10-2005-7020463 mailed Dec. 21, 2010.
Office Action from U.S. Appl. No. 11/523,381, dated: Sep. 30, 2010.
Response to Office Action from U.S. Appl. No. 11/523,381, filed: Nov. 24, 2010.
Office Action from U.S. Appl. No. 11/523,381, dated: Mar. 21, 2011.
Response to Office Action from U.S. Appl. No. 11/523,381, filed: Jun. 20, 2011.
Office Action from U.S. Appl. No. 12/384,277, dated: Apr. 28, 2011.
Notice of Allowance from U.S. Appl. No. 12/821,069, dated: Jun. 15, 2011.
Office Action from U.S. Appl. No. 12/845,629, dated: Apr. 6, 2011.
Office Action from U.S. Appl. No. 12/002,429, dated: Jun. 9, 2010.
Response to Office Action from U.S. Appl. No. 12/002,429, filed: Dec. 1, 2010.
Office Action from U.S. Appl. No. 12/002,429, dated: Sep. 12, 2011.
Office Action from U.S. Appl. No. 12/384,277, dated: Oct. 11, 2011.
Office Action from U.S. Appl. No. 11/708,990, dated: Nov. 15, 2011.
Office Action from U.S. Appl. No. 11/523,381, dated: Dec. 2, 2011.
Notice of Reasons for Rejection from Japanese Patent Application No. 2008-037765 dated Mar. 23, 2011.
Summary of Notice of Reasons for Rejection for Japanese Patent Application No. 2007-520314 mailed May 10, 2011.
Office Action for counterpart Japanese Patent Application No. JP 2006-513442 mailed May 12, 2011.
Office of the IPO for counterpart Taiwan Patent Application No. TW 093112133 issued Jun. 23, 2011.
Extended Search Report for European Patent Application No. EP 08170514.7 dated Aug. 8, 2011.
Notification of Reason(s) for Rejection for Japanese Patent Application No. 2008-309821 dated Sep. 12, 2011.
Notification of the Second Office Action for CN 200910137491.3 mailed Dec. 23, 2011.
Notice of Reasons for Rejection from Japanese Patent Application No. 2006-533962, dated Dec. 26, 2011.
Notification of Second Office Action from Chinese Patent Application No. 200780014958.4, dated Dec. 21, 2011.
Decision of Rejection from Japanese Patent Application No. 2009-507696, dated Dec. 26, 2011.
Communication pursuant to Article 94(3) EPC from Patent Application No. 04 788 908.4-1224, dated Jan. 27, 2012.
Office Action from U.S. Appl. No. 12/002,429, dated: Feb. 1, 2012.
Office Action from U.S. Appl. No. 12/771,938, dated: Feb. 1, 2012.
Response to Office Action from U.S. Appl. No. 12/821,069, filed: Apr. 25, 2011.
Office Action from U.S. Appl. No. 11/985,410, dated: Jan. 4, 2010.
Response to Office Action from U.S. Appl. No. 11/985,410, filed: Jan. 11, 2010.
Office Action from U.S. Appl. No. 12/384,277, dated: May 13, 2010.
Response to Office Action from U.S. Appl. No. 12/384,277, filed: Sep. 2, 2010.
Office Action from U.S. Appl. No. 11/708,990, dated: May 26, 2010.
Response to Office Action from U.S. Appl. No. 11/708,990, filed: Nov. 18, 2010.
Office Action from U.S. Appl. No. 11/985,410, dated: Jul. 15, 2010.
Response to Office Action from U.S. Appl. No. 11/985,410, filed: Dec. 14, 2010.
Office Action from U.S. Appl. No. 12/845,629, dated: Sep. 29, 2010.
Response to Office Action from U.S. Appl. No. 12/845,629, filed: Jan. 26, 2011.
Office Action from Taiwanese Patent Application No. 093112133, dated Jul. 27, 2012.
Interrogation from Japanese Patent Application No. 2009-507696, dated Aug. 21, 2012.
Decision of Rejection from Japanese Patent Application No. 2008-037765 dated Sep. 4, 2012.
Decision of Rejection from Japanese Patent Application No. 2006-513442, dated Aug. 23, 2012.
Notice of Reasons for Rejection for Japanese Patent Application No. 2006-533962, dated May 22, 2012.
Joseph S. Shor, et al., "Direct observation of porous SiC formed by anodization in HF", Appl. Phys. Lett. 62 (22), May 31, 1993.
Summary of Final Notice of Reasons for Rejection from Japanese Patent Application No. 2007-520314, dated May 8, 2012.
Examination Report from European Application No. 04 788 908.4-1224, dated Jun. 8, 2012.
Office Action from U.S. Appl. No. 11/523,381, dated Sep. 30, 2010.
Response to Office Action from U.S. Appl. No. 11/523,381, filed Nov. 24, 2010.
Office Action from U.S. Appl. No. 11/523,381, dated Mar. 21, 2011.
Response to Office Action from U.S. Appl. No. 11/523,381, filed Jun. 20, 2011.
Office Action from U.S. Appl. No. 12/384,277, dated Apr. 28, 2011.

(56) References Cited

OTHER PUBLICATIONS

Notice of Allowance from U.S. Appl. No. 12/821,069, dated Jun. 15, 2011.
Office Action from U.S. Appl. No. 12/845,629, dated Apr. 6, 2011.
Office Action from U.S. Appl. No. 12/002,429, dated Jun. 9, 2010.
Response to Office Action from U.S. Appl. No. 12/002,429, filed Dec. 1, 2010.
Office Action from U.S. Appl. No. 11/708,990, dated Feb. 16, 2011.
Decision of Final Rejection from Japanese Patent Application No. 2008-309822, dated Jun. 14, 2012.
First Office Action from Chinese Patent Application No. 200810186835.5 dated Jul. 3, 2012.
Notice of Reasons for Rejection from Japanese Patent Application No. 2009-507696, dated Feb. 5, 2013.
Office Action from Korean Patent Appl. No. 10-2008-7017800, dated Mar. 5, 2013 (Brown).
Office Action from Japanese Patent Appl. No. 2008-547566, dated Nov. 28, 2012 (Brown).
Office Action from U.S. Appl. No. 13/660,131, dated May 30, 2013.
Office Action from U.S. Appl. No. 13/347,243, dated Aug. 15, 2012.
Office Action from U.S. Appl. No. 12/635,818, dated Mar. 14, 2011.
Response to OA from U.S. Appl. No. 13/347,243, filed Sep. 27, 2012.
Response to OA from U.S. Appl. No. 12/635,818, filed Jun. 16, 2011.
Office Action from U.S. Appl. No. 12/635,818, dated Jul. 15, 2011.
Office Action from U.S. Appl. No. 12/635,818, dated Nov. 17, 2011.
Response to OA from U.S. Appl. No. 12/635,818, filed Sep. 26, 2011.
Response to OA from U.S. Appl. No. 12/635,818, filed Feb. 16, 2012.
Office Action from U.S. Appl. No. 13/347,243, dated Apr. 25, 2012.
Office Action from U.S. Appl. No. 12/384,277, dated Jun. 27, 2012.
Office Action from U.S. Appl. No. 11/523,381, dated Oct. 3, 2012.
Office Action from U.S. Appl. No. 12/384,277, dated Nov. 27, 2012.
Office Action from U.S. Appl. No. 12/845,629, dated Feb. 26, 2013.
Response to OA from U.S. Appl. No. 13/347,243, dated Jul. 20, 2012.
Response to OA from U.S. Appl. No. 12/384,277, dated Sep. 27, 2012.
Response to OA from U.S. Appl. No. 11/523,381, dated Dec. 21, 2012.
Response to OA from U.S. Appl. No. 12/384,277, dated Jan. 28, 2013.
Response to OA from U.S. Appl. No. 12/845,629, dated Apr. 18, 2013.
Office Action from U.S. Appl. No. 12/384,277, dated Mar. 26, 2013.
Response to OA from U.S. Appl. No. 12/384,277, filed Jun. 26, 2013.
Office Action from U.S. Appl. No. 11/523,381, dated Apr. 5, 2013.
Response to OA from U.S. Appl. No. 11/523,381, filed Jun. 5, 2013.
Office Action from U.S. Appl. No. 13/046,982, dated Dec. 12, 2012.
Response to OA from U.S. Appl. No. 13/046,982, filed Mar. 1, 2013.
Office Action from U.S. Appl. No. 13/046,982, filed Aug. 1, 2012.
Office Action from U.S. Appl. No. 13/046,982, filed Dec. 7, 2011.
Response to OA from U.S. Appl. No. 13/046,982, filed Sep. 20, 2012.
Office Action from U.S. Appl. No. 13/046,982, filed Jul. 19, 2011.
Response to OA from U.S. Appl. No. 13/046,982, filed Oct. 17, 2011.
Second Office Action from Chinese Patent Application No. 200810186835.5, dated Feb. 25, 2013.
Official Action from European Patent Appl. No. 05 761 972.8-1508, dated Mar. 5, 2013.
Interrogation from Japanese Patent Application No. 2008-37765, dated Mar. 19, 2013.
Office Action from Japanese Patent Application No. 2011-229090, dated Apr. 16, 2013.
Decision of Rejection from Japanese Patent Application No. 2007-520314, dated Apr. 23, 2013.
Decision of Dismissal of Amendment from Japanese Patent Application. No. 2007-520314, dated Apr. 23, 2013.
Decision of Rejection from Japanese Patent Application No. 2006-533962 dated Apr. 23, 2013.
Kasugai, et al. "Moth-Eye Light Emitting Diodes", Mater. Res. Soc. Symp. Proc. vol. 831 © 2005 Materials Research Society.
Decision of Rejection from Chinese Patent Appl. No. 2009-10137491.3, dated Apr. 15, 2013.
Notification of Reasons for Rejection from Japanese Patent Application No. 2011-248746, dated Jan. 31, 2013.
Inquiry from an Appeal Board from Japanese Patent Appl. No. 2006-513442, dated Mar. 13, 2013.
Official Action from European Patent Appl. No. 05761972.8, dated Mar. 8, 2013.
Office Action and Search Report from Taiwanese Patent Appl. No. 094121086, dated May 15, 2013.
Streubel, et al., "High Brightness AlGaInP Light-Emitting Diodes", IEEE Journal of Selected Topics in Quantum Electronics, vol. 8, No. 2, pp. 324-325, Mar./Apr. 2002.
Decision of Rejection from Japanese Patent appl. No. 2010-254633, dated Jun. 4, 2013.
Interrogation from Japanese Patent Appl. No. 2009-507696, dated: Mar. 11, 2014.
Fourth Office Action from Chinese Patent Appl. No. 2008-10186835.5, dated Mar. 5, 2014.
Notice of Reasons for Rejection from Japanese Patent Appl. No. 2013-509039, dated Mar. 11, 2014.
Decision to Refuse a European Patent Application from European Patent Appl. No. 10 181 251.9-1555, dated Apr. 22, 2014.
Office Action from U.S. Appl. No. 12/002,249, dated Feb. 26, 2014.
Office Action from U.S. Appl. No. 11/738,665, dated Nov. 8, 2013.
Office Action from U.S. Appl. No. 12/845,629, dated Sep. 24, 2013.
Office Action from U.S. Appl. No. 12/845,629, dated Feb. 11, 2014.
Office Action from U.S. Appl. No. 11/708,990, dated Feb. 12, 2014.
Reasons for Rejection from Japanese Patent Appl. No. 2010-254633, dated Dec. 24, 2013.
Reasons for Rejection from Japanese Patent Appl. No. 2012-274904, dated Jan. 7, 2014.
Re-Examination from Taiwanese Patent Appl. No. 100145116, dated Dec. 19, 2013.
Office Action from Japanese Patent Appl. No. 2007-520314, dated Nov. 12, 2013.
Office Action from Taiwanese Patent Appl. No. 094121086, dated Dec. 10, 2013.
Reasons for Rejection from Japanese Patent Appl. No. 2006-513442, dated Sep. 9, 2013.
Notification of Reasons for Rejection from Japanese Patent Appl. No. 2008-309821, dated Sep. 19, 2013.
Final Notification of Reasons for Rejection from Japanese Patent Appl. No. 2006-513442, dated Feb. 13, 2014.
Examination from European Patent Appl. No. 07754938.4-1564, dated Mar. 18, 2014.
Reasons of Rejection from Japanese Patent appl. No. 2011-229090, dated Mar. 3, 2014.
Reasons of Rejection from Japanese Patent appl. No. 2012-20751, dated Feb. 13, 2014.
Examination Report from European Patent Appl. No. 04788908.4-1901, dated Jan. 9, 2014.
Interrogation from Japanese Patent Appl. No. 2006-533962, dated Dec. 10, 2013.
First Office Action from Chinese Patent Appl. No. 201110379964.8, dated Nov. 22, 2013.
Notice of Reasons for Rejection from Japanese Patent Appl. No. 2012-288056, dated Dec. 10, 2013.
Office Action from Japanese Patent Appl. No. 2012-232743, dated Nov. 20, 2013.
Office Action from Japanese Patent Appl. No. 2012-232744, dated Nov. 20, 2013.
Office Action from U.S. Appl. No. 11/708,990, dated Jul. 11, 2013.
Office Action from U.S. Appl. No. 12/002,429, dated Aug. 9, 2013.
Office Action from U.S. Appl. No. 10/786,755, dated Jun. 12, 2013.
Response to OA from U.S. Appl. No. 10/786,755, filed Sep. 10, 2013.

(56) References Cited

OTHER PUBLICATIONS

Office Action from U.S. Appl. No. 11/523,381, dated Sep. 17, 2013.
Reasons for Rejection from Japanese Patent Appl. No. 2011-150211, dated Aug. 26, 2013.
Reasons for Rejection from Japanese Patent Appl. No. 2011-229090, dated Aug, 27, 2013.
Reasons for Rejection from Japanese Patent Appl. No. 2009-507696, dated Aug. 20, 2013.
Third Office Action from Chinese Patent Appl. No. 200810186835.5, dated Aug. 22, 2013.
Reasons for Rejection from Japanese Patent Appl. No. 2012-232744, dated Jun. 26, 2013.
Office Action from Japanese Patent appl. No. 2012-232743, dated Jun. 25, 2013.
Decision of Final Rejection from Japanese Patent Appl. No. 2011-248746, dated Jun. 12, 2013.
Reasons of Rejection from Japanese Patent Appl. No. 2006-533962, dated Jun. 3, 2014.
Decision of Dismissal of Appeal against Final Rejection from Korean Patent Appl. No. 10-2011-7028750, dated Jun. 11, 2014.
Decision of Patent Grant from Japanese Patent Appl. No. 2007-520314, dated Jun. 3, 2014.
Reasons for Rejection from Japanese Patent Appl. No. 2011-150211, dated May 14, 2014.
Decision of Rejection from Japanese Patent Appl. No. 2012-288056, dated Jun. 3, 2014.
Minutes from European Patent Office No. 10 181 251.9 dated Apr. 22, 2014.
Office Action from Korean Application 10-2006-7017800, dated Feb. 27, 2014 (Myers).
Office Action from U.S. Appl. No. 11/523,381, dated Apr. 11, 2014.
Office Action from U.S. Appl. No. 11/738,665, dated May 1, 2014.
Intention to Grant from European Patent Application No. 04788908.4-191, dated Jul. 14, 2014.
Decision of Rejection from Japanese Patent Appl. No. 2012-274904, dated Jul. 1, 2014.
Summary of the Appeal Decision from Japanese Patent Appl. No. 2008-309821, dated Jun. 28, 2014.
Office Action from U.S. Appl. No. 12/002,429, dated May 30, 2014.
Response to OA from U.S. Appl. No. 12/002,429, filed Jul. 10, 2014.
Office Action from U.S. Appl. No. 11/523,381, dated Jul. 2, 2014.
Decision of Rejection from Japanese Patent Appl. No. 2011-150211, dated Oct. 14, 2014.
Examination Report from European Patent Appl. No. 08 170 514.7-1564, dated Nov. 12, 2014.
Examiner's Reconsideration Report from Japanese Appl. No. 2012-232743, dated Nov. 10, 2014.
Decision of Re-Examination from Chinese Appl. No. 200910137491.3, dated Nov. 21, 2014.
Office Action and Search Report from Taiwanese Appl. No. 101138314, dated Aug. 5, 2014.
Office Action from Taiwanese Appl. No. 093112133, dated Jul. 25, 2014.
Notification to Grant from Chinese Patent Appl. No. 200810186835.5, dated Aug. 25, 2014.
Office Action from U.S. Appl. No. 10/786,755, dated Aug. 7, 2014.
Translation from Japanese to English of Kaizu, M. (JP-(H)04-(0)28269), "Mounting Structure for an LED Bare Chip", published Jan. 30, 1992: prepared by the Translations Branch at the U.S. Patent and Trademark Office.
Decision of Rejection from Japanese Patent Appl. No. 2013-509039, dated Oct. 7, 2014.
Decision of Dismissal of Amendment from Japanese Patent Appl. No. 2011-229090, dated Jul. 29, 2014.
Second Office Action from Chinese Patent Appl. No. 2011103799648, dated Jul. 11, 2014.
Official Action from Japanese Patent Appl. No. 2011-248746, dated Aug. 4, 2014.
Trial Decision and Notice of Allowance from Japanese Patent Appl. No. 2013-16358, dated Apr. 14, 2015.
Preliminary Examination Report from Japanese Patent appl. No. 2012-274904, dated Jan. 26, 2015.
Third Office Action from Chinese Patent Appl. No. 2011-103799648, dated Jan. 13, 2015.
Pretrial Report from Japanese Patent Appl. No. 2012-288056, dated Jan. 21, 2015.
Final Notification of Reasons for Rejection from Japanese Patent Appl. No. 2011-248746, dated Jan. 13, 2015.
First Office Action and Search Report from Chinese Appl. No. 2011800219066, dated Dec. 26, 2014.
Office Action from U.S. Appl. No. 12/002,429, dated Nov. 12, 2014.
Office Action from U.S. Appl. No. 11/738,665, dated Nov. 28, 2014.
Office Action from U.S. Appl. No. 11/523,381, dated Dec. 8, 2014.
Office Action from U.S. Appl. No. 10/786,755, dated Dec. 31, 2014.
Office Action from U.S. Appl. No. 11/708,990, dated Feb. 13, 2015.
Office Action from U.S. Appl. No. 11/523,381, dated Mar. 13, 2015.
Fourth Office Action from Chinese Patent Appl. No. 2009101374913, dated Apr. 21, 2015.
Office Action from Japanese Appl. No. 2011-229090, dated Jun. 2, 2015.
Office Action from U.S. Appl. No. 12/002,429, dated May 7, 2015.
Office Action from U.S. Appl. No. 11/738,665, dated May 11, 2015.
Certificate of Patent for Japanese Patent Appl. No. 2006-533962, dated May 22, 2015.
Appeal Decision in Japanese Patent Appl. No. 2012-274904, dated Jun. 23, 2015.
Fourth Office Action from Chinese Patent Appl. No. 2011103799648, dated Jul. 14, 2015.
Reasons for Rejection from Japanese Patent Appl. No. 2011-229090, dated Jun. 2, 2015.
Office Action from U.S. Appl. No. 12/002,429, dated Sep. 24, 2015.
Office Action from U.S. Appl. No. 11/523,381, dated Oct. 7, 2015.
Response to OA from U.S. Appl. No. 10/836,743, filed Dec. 2, 2015.
Examination from European Patent Appl. No. 05 761 972.8-1504, dated Nov. 9, 2015.
Notice of Allowance for Application No. 20110-229090; Dated Apr. 18, 2016.
Appeal Decision for Application No. 2014-10492; Dated May 8, 2016.
Decision of Rejection from Chinese Patent Appl. No. 2011103799648, dated Jan. 21, 2016.
Notice of Allowance from Chinese Patent Appl. No. 201180021906.6, dated Mar. 17, 2016.
Request for Correction from Chinese Patent Appl. No. 2011500219066, dated Feb. 26, 2016.
Notice of Allowance from Japanese Patent Appl. No. 2013-509039, dated Mar. 8, 2016.
Office Action from U.S. Appl. No. 11/523,381; Feb. 12, 2016.
Office Action from U.S. Appl. No. 14/302,113; Mar. 10, 2016.
Office Action from Japanese Patent Appl. No. 2013-509039, dated Aug. 3, 2015.
Office Action From China Dated Apr. 29, 2008.

* cited by examiner

HIGH POWERED LIGHT EMITTER PACKAGES WITH COMPACT OPTICS

This application claims the benefit of U.S. Provisional Application Ser. No. 60/467,193 filed Apr. 30, 2003.

BACKGROUND OF THE INVENTION

Field of the Invention

This invention relates to light emitters and, more particularly, to light emitter packages with components arranged to withstand thermal stresses.

Description of the Related Art

Light emitters are an important class of solid-state devices that convert electrical energy to light. One such light emitter is a light emitting diode (LED) which generally includes an active region of semi-conductive material sandwiched between two oppositely doped regions. When a bias is applied across the doped regions, holes and electrons are injected into the active region where they recombine to generate light. The light can be emitted from the active region and through the surfaces of the LED.

LEDs are generally divided into classes depending on their power rating. Although there is no standard range for the different classes, low power LEDs typically have a power rating in the range of 0.1 Watts to 0.3 Watts, or lower, and high power LEDs typically have a rating in the range of 0.5 Watts to 1.0 Watt, or higher.

Conventional packaging for low power LEDs typically includes a reflector cup with the LED mounted at the bottom of the cup. Cathode and anode leads are electrically coupled to the LED to provide power. The cathode lead can extend through the reflector cup and the anode lead can be wire bonded. The main function of the reflector cup is to redirect light emitted in certain directions in order to control the far-field intensity pattern of the LED. The reflector cup can include a highly reflective surface finish and can be plate stamped or metal plated with a metal such as aluminum (Al) or silver (Ag).

The entire structure can be encased in a transparent, hard encapsulant such as a plastic or epoxy. The encapsulant serves a number of functions. One function is to provide a hermetic seal for the LED chip. In another function, light refracts at the encapsulant/air interface, so that the outside shape of the encapsulant can act as a lens to further control the intensity pattern of the LED.

One disadvantage of this packaging arrangement, however, is that the LED chip, the reflector cup, and the encapsulant each generally have different coefficients of thermal expansion (CTE). Hence, during operational heating cycles they expand and contract at different rates, which can place a high mechanical stress on the device. In particular, epoxies and silicones typically used for the encapsulant have a CTE that is very different from the CTE of metals or ceramics. The CTE mismatch can also be exacerbated by constraints imposed by the manufacturing flow, such as during epoxy curing. In addition, these packages do not dissipate heat from the LED chip efficiently as they lack good thermal properties. However, because the LED operates at low power, the amount of heat it produces is relatively low so that the differences in CTE do not result in unacceptable failure rates.

High power LEDs, however, are generally larger, use larger packaging components, and generate higher amounts of heat. As a result, the CTE mismatch has a much larger impact on reliability and if the low-power LED type packaging is used, the differences in CTE for the packaging components can result in unacceptable failure rates. One of the most common failures is fracturing or cracking of the encapsulant.

High power LED packages have been introduced having a heat spreader that serves as a rigid platform for the remainder of the components, and is made of a material with high thermal conductivity such as a metal or ceramic that helps to radiate heat away from the LED chip. A reflector cup is mounted to the platform with the LED chip mounted at the bottom of the cup. The LED chip is contacted by wire bonds from the rigid platform. The reflector cup, LED chip and wire bonds are encased in an optically clear material that provides environmental protection. To compensate for the different coefficients of thermal expansion (CTE) of the package components, the optically clear material can include a soft gel such as silicone. As the different components expand and contract through thermal cycles, the soft gel readily deforms and compensates for the different CTEs.

However, soft gel is not as robust as plastics, epoxies, and glass, and cannot be used in some harsh environments without a coating or cover to act as a hermetic seal, which adds complexity to the LED fabrication process. The soft gel also tends to absorb water, which can shorten the LED's lifespan. It is also more difficult to shape soft gels to control the emission pattern of the LED package.

Other high power LED packages have been introduced that utilize a hard epoxy encapsulant, with one such device not utilizing a reflector cup inside the encapsulant. Instead, a second region is included on the heat spreader, with a section of the second region stamped, molded or etched to form a depression that can be coated with a reflective material. The LED chip is then placed at the base of the depression and is contacted. A hard epoxy or silicone fills the depression, covering the LED and any wire bonds. This arrangement reduces, but does not eliminate, the fractures and cracking of the epoxy or silicone encapsulant. This arrangement can also suffer from a different problem of the epoxy or silicone encapsulant delaminating and peeling away from the surfaces of the depression through the LED's thermal cycles.

U.S. Pat. No. 6,274,924 to Carey et al. discloses another high power LED package that includes a heat sinking slug that is inserted into an insert molded leadframe. The slug can include a reflector cup with the LED chip and thermally conductive submount arranged at the base of the cup. Metal leads are electrically and thermally isolated from the slug. An optical lens is added by mounting a thermoplastic lens over the slug. The lens can be molded to leave room for a soft encapsulant between the LED and the inside surface of the lens. This invention claims to operate reliably under high power conditions, but is complex, difficult to manufacture, and expensive. The thermoplastic lens also does not survive high temperatures typically used for the process of soldering LEDs to a printed circuit board.

SUMMARY OF THE INVENTION

The present invention seeks to provide LED packages that are particularly adapted to use with high power LEDs and are arranged to reduce the LED package failures due to the differences in the CTE for the package components. The LED packages are also simple, flexible, and rugged.

One embodiment of a light emitter according to the present invention comprises a substantially supporting surface, a light source positioned on the supporting surface, and an encapsulant positioned on the supporting surface. The encapsulant surrounds the light source and is capable of expanding and contracting in response to a change in temperature, constrained only by adhesion to said planar support surface.

Another embodiment of a light emitter according to the present invention comprises a heat spreader and a light source positioned in thermal contact with a substantially planar surface of the heat spreader. The heat spreader provides support for said light source and an encapsulant is positioned to surround the light source, with the encapsulant capable of expanding and/or contracting in response to a change in temperature constrained only by adhesion to said planar surface. A first reflective element is positioned to reflect light from the light source, the reflective element being integrated with at least one of the heat spreader and the encapsulant.

One embodiment of an optical display according to the present invention comprises a heat spreader with a substantially planar surface. A plurality of light emitters are positioned on the planar surface with each light emitter comprising a light source positioned in thermal contact with the heat spreader. An encapsulant is positioned on the heat spreader to surround the light source with the encapsulant being capable of expanding and contracting in response to a change in temperature constrained only by adhesion to said planar surface. Each light emitter comprises at least one reflective element positioned on the heat spreader and/or said encapsulants to increase the light emitting efficiency of the display.

One embodiment of a method of fabricating a light emitter includes providing a substantially planar supporting surface and providing a light source positioned on the substantially planar supporting surface. An encapsulant is provided positioned on the supporting surface and over the light source so that the encapsulant can expand and contract with changes in temperature constrained only by adhesion to said planar surface.

These and other further features and advantages of the invention would be apparent to those skilled in the art from the following detailed description, taken together with the accompanying drawings, in which:

DETAILED DESCRIPTION OF THE INVENTION

Figure 1:
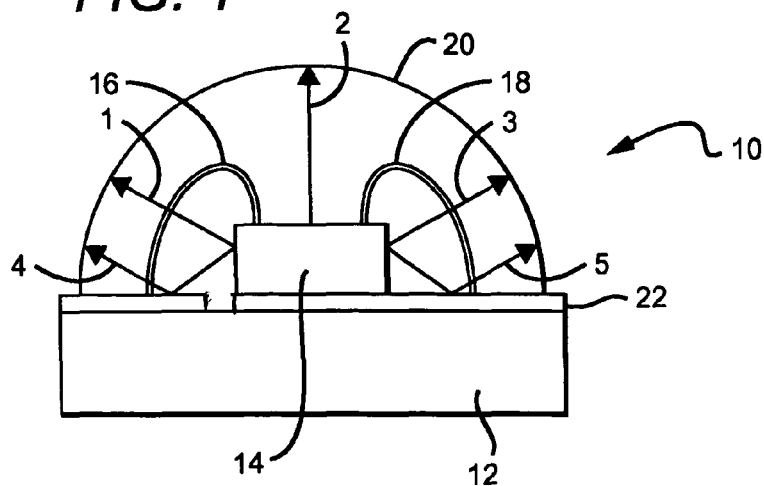
FIG. 1 is a simplified sectional view of a light emitter according to the present invention.

FIG. 1 illustrates one embodiment of a light emitter 10 in accordance with the present invention. Emitter 10 includes a heat spreader 12 with a light source 14 positioned on and in thermal contact with the heat spreader region 12. Spreader region 12 provides a support structure for holding light source 14 and is at least partially made of a high thermal conductivity material to facilitate heat flow away from light source 14. The preferred heat spreader is made of a high thermal conductive material such as copper (Cu), aluminum (Al), aluminum nitride (AlN), aluminum oxide (AlO), silicon (Si), silicon carbide (SiC) or combinations thereof.

Light source 14 comprises an LED, although it can include other light emitters, such as a solid-state laser, a laser diode, or an organic light emitting diode, among others. Power to light source 14 can be provided from first and second wire bonds 16, 18 with a bias applied across the light source 14, and in the embodiment shown the wire bonds apply a bias across oppositely doped layers of the LED light source to cause it to emit light. In other embodiments according to the present invention only one wire bond can be used, with the light source 14 also contacted through the spreader region 12. In still other embodiments, the light source 14 is contacted only through the spreader region 12.

Emitters according to the present invention can be included in systems designed to emit light either as a single light source or in a display. Emitters according to the invention can also include a single light source or an array of light sources which emit the same or different wavelengths of light. Emitter 10 and the emitters in the following figures are shown with one light source for simplicity and ease of discussion. It is understood, however, that emitters according to the present invention can be arranged in many different ways.

A transparent encapsulant 20 is positioned to surround light source 14 and is provided to encapsulate and hermetically seal light source 14 and wire bonds 16, 18. Encapsulant 20 is typically positioned on the top surface of spreader region 12. Encapsulant 20 can be made of many different hard and optically clear materials such as epoxy, silicone, glass, or plastic, and can be a pre-molded lens or formed directly over light source 14. Pre-molded encapsulants or lenses can be fabricated using techniques, such as injection molding, and then bonded to heat spreader 12.

The spreader region 12 can also include a reflective layer 22 on the same surface as the light source 14, with the reflective layer 22 at least covering substantially all of the surface not covered by the light source 14. In the embodiment shown, the reflective layer 22 covers the entire surface such that part of said reflective layer is sandwiched between the light source 14 and the spreader region 12. Light source 14 emits light omnidirectionally with light paths 1, 2, 3, 4 and 5 representing a few of the possible light paths from the light source. Light paths 1, 2 and 3 extend from light source 14 and through encapsulant 20. Light can also flow along light paths 4 and 5 which extend from light source 14 to the reflective layer 22 and through encapsulant 20. Reflective layer 22 can reflect light from light source 14 to increase the optical efficiency of emitter 10. Reflective layer 22 can comprise many reflective materials reflective at the wavelength of interest, such as aluminum (Al), silver (Ag), or a combination thereof.

Emitter 10 has many advantages, one being that it is less complex and, consequently, costs less than conventional devices. The complexity is reduced in one way by combining the reflector layer 22 with spreader region 12 which eliminates the need to have a reflector structure separate from encapsulant 20 and heat spreader 12, which allows for a simplified manufacturing process.

Thermal stresses are also reduced because the reflector function is integrated with other components included in emitter 10. Hence, there are fewer components expanding and contracting against each other at different rates. As a result, light source 14 can operate more reliably at higher power and, consequently, higher temperature with less risk of having emitter 10 fail. Another cause of failure can be the fracturing or cracking of encapsulant 20 associated with CTE mismatch between the different materials used. However, the probability of this happening is reduced by the arrangement of emitter 10. The surface between encapsulant 20 and spreader region 12 around the emitter 10 is substantially planar so that at the interface between the encapsulant 20 and the spreader region 12 around the emitter 10, encapsulant 20 is only constrained at this substantially planar surface. The encapsulant 20 can also be constrained at the surfaces of said emitter. This puts less stress on wire bonds 16 and/or 18 which can cause them to break or loosen and reduce the useful lifetime of emitter 10.

Encapsulant 20 can include hard and high melting point materials, such as glass, to provide a package which is hermetically sealed because the curing process and temperature cycles associated with these materials is no longer a problem. Emitter 10 also provides for greater flexibility in the choice of materials which can be used for encapsulant 20 and spreader region 12 because they can be matched for adhesion. Hence, the probability of encapsulant 20 delaminating and peeling away from spreader region 12 through the emitter's thermal cycles is reduced.

Another advantage is that light emitter 10 has a smaller footprint so that an array of packages can be positioned closer together. This feature is useful in light displays where it is typically desired to position the packages close together in an array to increase resolution and display quality.

FIGS. 2 through 8 illustrate additional embodiments of light emitters in accordance with the present invention. It should be noted that the emitters illustrated in the rest of the disclosure include components similar to the components illustrated in FIG. 1 and similar numbering is used with the understanding that the discussion above in conjunction with emitter 10 applies equally well to the emitters discussed in FIGS. 2 through 8.

Figure 2:
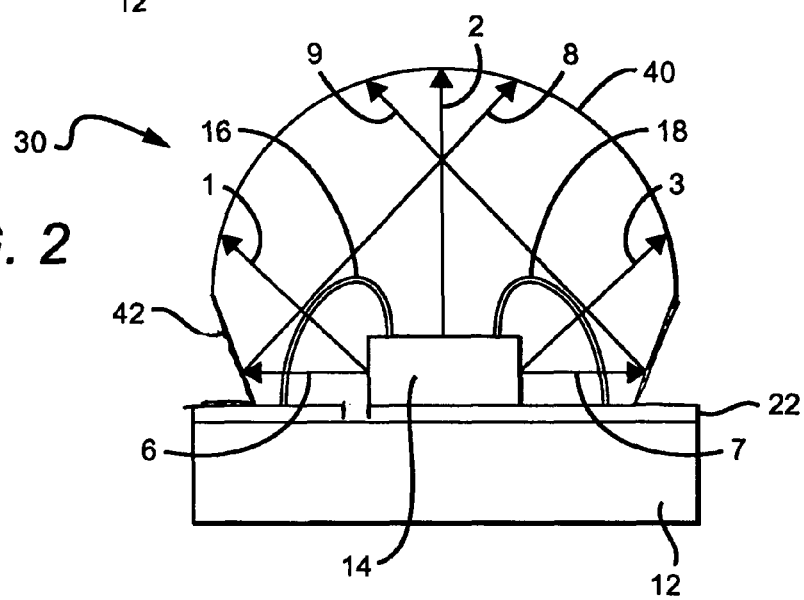
FIG. 2 is a simplified sectional view of another embodiment of a light emitter according to the present invention.

FIG. 2 illustrates another embodiment of a light emitter 30 in accordance with the present invention. Emitter 30 includes spreader region 12 and can include a reflective layer 22. Light source 14 is positioned on reflective layer 22 and an encapsulant 40 is positioned to encapsulate and seal light source 14. Encapsulant 40 is shaped around its base to provide an angled surface 42 that reflects sideways directed light emitted from light source 14 by total internal reflection.

Light paths 6, 7 show two possible light paths from the light source 14, both of which are incident to surface 42. Light paths 6 and 7 can be reflected by total internal reflection (TIR) by surface 42 toward the top of encapsulant 40 along respective light paths 8 and 9. This reduces the light that is emitted out the sides of encapsulant 40 and increases the light emitted out of the top. As a result, emitter 30 can produce more focused light with better light emission efficiency. It should be noted that light emitted from light source 14 can also be reflected from reflective layer 22 and through encapsulant 40, either directly or indirectly off of surface 42 to further enhance emission efficiency. Light emitter 30 includes all of the features of emitter 10 described above, with the added advantage of more focused light, better optical efficiency.

Figure 3:
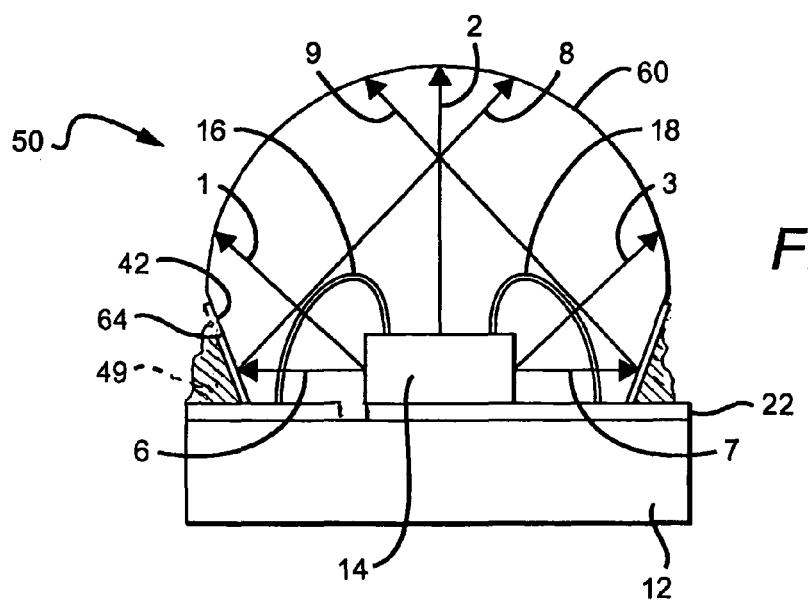
FIG. 3 is a simplified sectional view of another embodiment of a light emitter according to the present invention having a shaped lens.

FIG. 3 illustrates another embodiment of a light emitter 50 in accordance with the present invention, which is similar to emitter 30 in FIG. 2. Emitter 50 includes spreader region 12 with a reflective layer 22 on the spreader region 12. A light source 14 is positioned on reflective layer 22 and an encapsulant 60 positioned to surround light source 14 and to provide hermetic sealing. Encapsulant 60 also comprises an angled surface 42 with reflective layer 64 applied to angled surface 42. Support region 49 is positioned adjacent to second reflective layer 64 and spreader region 22.

Second reflective layer 64 reflects most or all of the light incident on the angled surface 42 including the light that does not experience TIR and would otherwise pass through angled surface 42. This further focuses the light from light source 14 toward the top of encapsulant 60 and increases the optical efficiency by increasing the amount of emitted light. Second reflective layer 64 can be made of different materials with different reflectivities, such as silver (Ag), aluminum (Al), titanium oxide (TiO), white resin, or combinations thereof. Second reflective layer 64 can be applied using many different methods such as painting, plating, or deposition and can also be applied before or after encapsulant 60 is positioned over light source 14. An additional advantage of layer 64, which is opaque to light, is that it allows optional barrier region 49 to be included for mechanical support and environmental protection without degrading the light efficiency of emitter 50. The material used for region 49 should be chosen so that it does not constrain the encapsulant 60 under thermal cycling.

Figure 4:
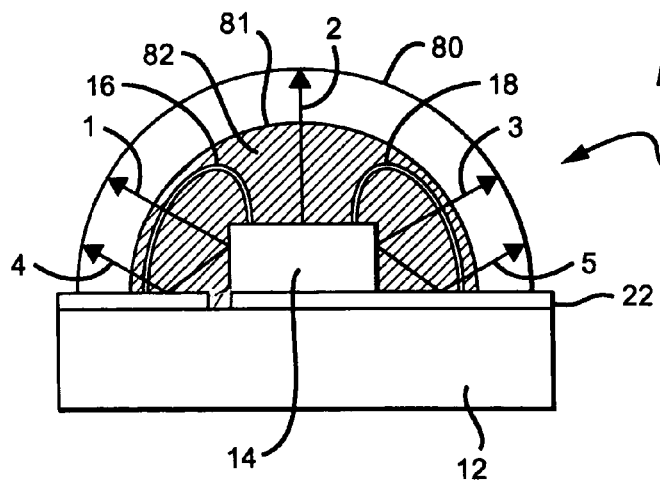
FIG. 4 is a simplified sectional view of another embodiment of a light emitter according to the present invention having a reflective surface on the shaped lens.

FIG. 4 illustrates another embodiment of light emitter 70 in accordance with the present invention, which is similar to emitter 10 of FIG. 1. Emitter 70 includes spreader region 12, light source 14, and a reflective layer 22. Emitter 70 also comprises an encapsulant 80 that is a preformed lens having a cavity 81 in its base. Like the encapsulants described above, lens 80 can be made of an epoxy, silicone, glass, or plastic and can be fabricated using methods such as injection molding. Encapsulant 80 is mounted over light source 14 to the top surface of heat spreader 12 with light source 14 and wire bonds 16, 18 arranged in cavity 81. A bonding material 82 fills the space in cavity 81 and holds lens 80 to heat spreader 12. Different types of encapsulants can be used provided they are sized to fit on heat spreader 12 while providing a cavity for light source 14, wire bonds 16, 18 and bonding material 82.

Bonding material 82 can include different materials such as an epoxy, glue, or silicone gel. The index of refraction of bonding material 82 is preferably the same as that of encapsulant 80 to minimize reflections between the two materials and can be chosen to obtain a desired light emitting efficiency. Material 82 can be positioned in cavity 81 before encapsulant 80 is positioned over light source 14 or encapsulant 80 can be positioned in place and material 82 can be injected through encapsulant 80 or through a hole (not shown) in heat spreader 12. The hole can then be sealed with a plug made from resin or a similar material.

This arrangement has the advantages of emitter 10 with added flexibility in the type and shape of encapsulant that can be mounted over light source 14 and heat spreader 12. Different types of lenses can be used provided they are sized on the spreader region 12 while providing a cavity for the light emitter 14, wire bonds 16, 18, and the bonding material 82. If silicone gel is used for material 82, then it can compensate for differences in the CTE of the different materials.

Figure 5:
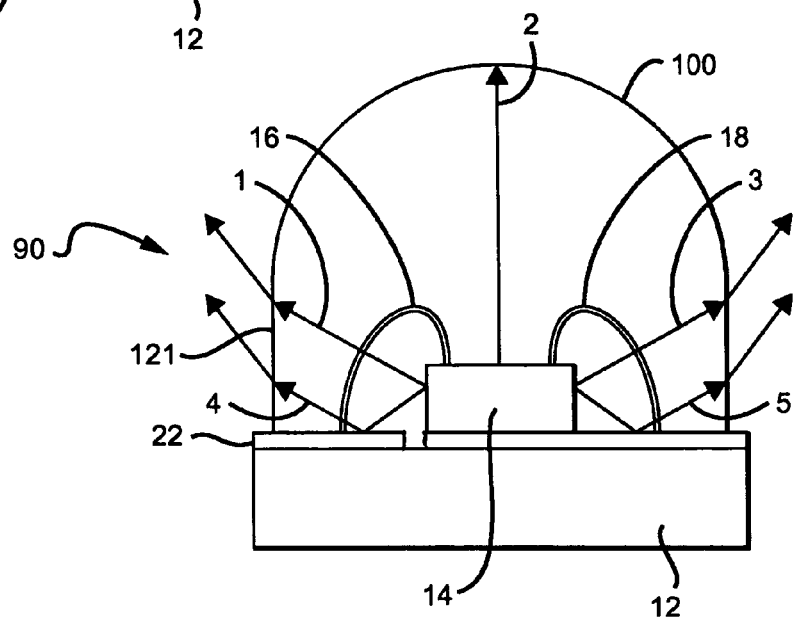
FIG. 5 is a simplified sectional view of another embodiment of a light emitter according to the present invention having a bullet shaped lens.

FIG. 5 illustrates another embodiment of a light emitter 90 in accordance with the present invention. Emitter 90 includes spreader region 12, light source 14, and reflective layer 22. Emitter 90 also includes a hard "bullet shaped" encapsulant 100, which can be a pre-molded lens or an epoxy positioned over light source 14 and shaped. The shape of encapsulant 100 is chosen to refract light along light paths 1, 3, 4, and 5 toward the top of emitter 90 as the light passes out of encapsulant 100 at a surface 121. This light refraction helps to focus the light from light source 14. Light that hits the surface of encapsulant 100 at exactly 90° (i.e. along light path 2) will not be refracted.

Figure 6:
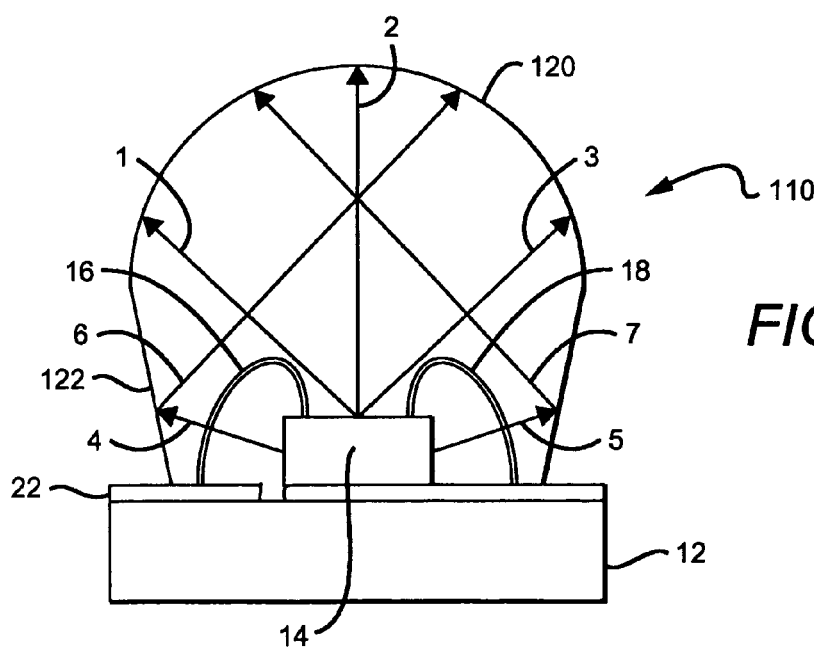
FIG. 6 is a simplified sectional view of another embodiment of a light emitter according to the present invention having a concave shaped lens.

FIG. 6 illustrates another embodiment of a light emitter 110 according to the present invention which also includes a spreader region 12, light source 14, and reflective layer 22. Emitter 110 also includes a "concave" shaped encapsulant 120 that more effectively reflects light internally toward the top of emitter 110 and can also more efficiently refract light passing out of the encapsulant 120 toward the top of the emitter 110. Encapsulant 120 includes an angled surface 122 which is shaped in such a way to increase the focusing power of encapsulant 120 and the light emitting efficiency of emitter 110. The angle and shape of surface 122 can be chosen to obtain a desired gain in focusing the light and to decrease any losses from TIR. The angled surface 122 can be straight or substantially straight and can be adjacent to the "concave" portion of the encapsulant 120. The angled surface 122 and the "concave" portion of the encapsulant 120 can be external surfaces.

Figure 7:
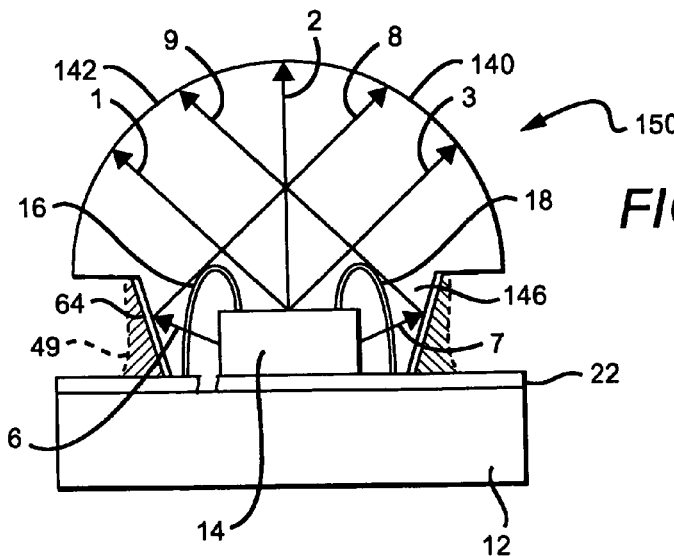
FIG. 7 is a simplified sectional view of another embodiment of a light emitter according to the present invention having a mushroom shaped lens.

FIG. 7 illustrates another embodiment of light emitter 130 in accordance with the present invention that comprises spreader region 12, light source 14, wire bonds 16 and 18, and reflective layer 22. Emitter 130 also comprises a mushroom shaped encapsulant 140 having a dome 142 and angled stem 146. Stem 146 can be covered by a second reflective layer 147 such that light from light source 14 that strikes stem 146 along light paths 6 and 7 is reflected toward dome 142 along respective light paths 8 and 9. This arrangement also provides focused light and is more efficient because less light is lost to TIR.

Figure 8:
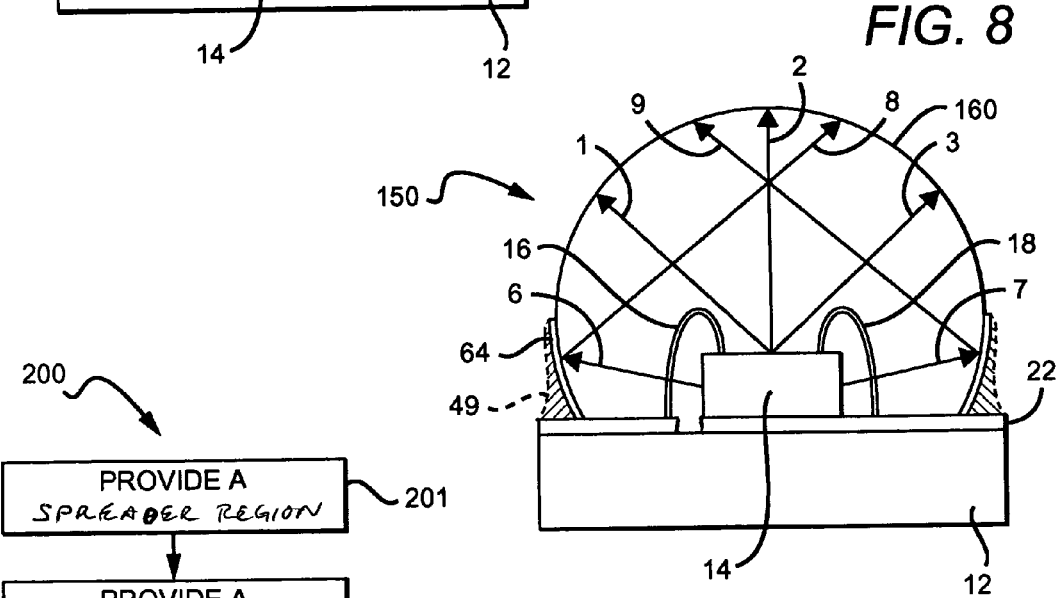
FIG. 8 is a simplified sectional view of another embodiment of a light emitter according to the present invention having a circular spherical shaped lens.

FIG. 8 illustrates still another embodiment of a light emitter 150 in accordance with the present invention, which includes a spreader region 12, light source 14, and reflective layer 22. Emitter 150 also includes a spherical shape encapsulant 160 that can also include a reflective region 64 on its lower hemisphere to reflect light along light paths 6 and 7 toward the top of encapsulant 160 along respective light paths 8 and 9. This arrangement also provides focused light and has less TIR losses because of encapsulant 160 and reflective region 64. It is also understood that the encapsulant can be many other detailed shapes in accordance with the present invention.

Figure 9:
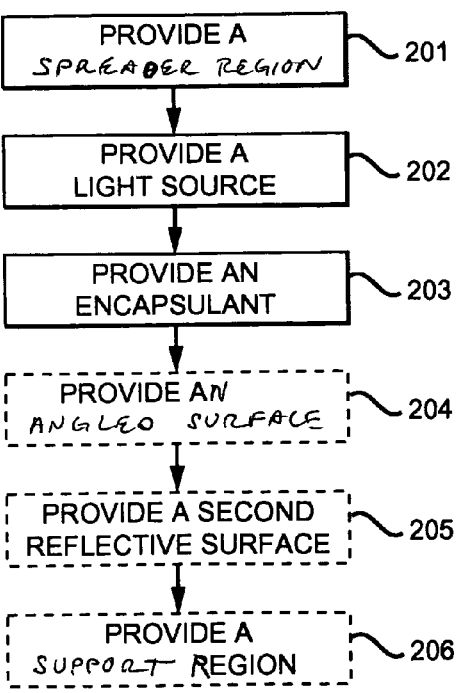
FIG. 9 is a simplified flowchart illustrating a method of fabricating a light emitter according to the present invention.

FIG. 9 illustrates a flowchart 200 for one embodiment of a method for fabricating a light emitter in accordance with the present invention. The method includes step 201 of providing a spreader region having at least one planar surface with a reflective layer on it, and step 202 includes providing a light source positioned on at least one planar surface. Step 203 comprises providing an encapsulant positioned on the planar surface of the spreader region and over the light source. By being planar the expansion and contraction of the encapsulant with changes in temperature is constrained only at the planar surface.

The encapsulant can be positioned so that it hermetically seals the light source, where the hermetic seal remains unbroken with changes in temperature. The encapsulant can be positioned so that the relative position of the encapsulant and light source remains unchanged with changes in temperature. The relative position will remain unchanged if there is nothing (i.e. a 3D reflector structure) for the encapsulant to push against as the temperature changes.

An optional step 204 comprises angling the surface of the encapsulant adjacent to the spreader region to increase the efficiency of the emitter by directing TIR light and refracted light toward the top of the emitter.

An optional step 205 comprises providing a second reflective element positioned on the angled surfaces to increase the emission efficiency of the emitter. The second reflective element can be formed by using one of painting, plating, and deposition. An optional step 206 can comprise providing a support region position adjacent to the second reflective element and the spreader region. A barrier region may then be positioned adjacent to the supporting surface and a base of the encapsulant. The barrier region can form a better seal for the light source. It should be noted that the steps illustrated in flowchart 200 can be performed in a different order and that different steps can be used in methods according to the present invention.

Although the present invention has been described in considerable detail with reference to certain preferred configurations thereof, other versions are possible. The lenses described above can have many different shapes and can be made of many different materials. Each of the light sources described above can further comprise a submount to provide protection from electrostatic discharge (ESD). In each embodiment above, the heat spreader can be etched to provide a hole to house the light source such that the light source does not extend above the top surface of the heat spreader. The encapsulant could then have a flat base to mount to the heat spreader, over the light source.

Therefore, the embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A light emitter, comprising:
    a substantially planar supporting surface comprising a thermally conductive heat spreader and a reflective layer on said thermally conductive heat spreader, said reflective layer shaped to define a discontinuity;
    a solid state light source on said reflective layer and in thermal communication with said thermally conductive heat spreader to draw heat away from said light source, said supporting surface providing a substantially planar surface around said light source; and
    an encapsulant on said substantially planar supporting surface and surrounding said light source, said reflective layer between said encapsulant and said thermally conductive heat spreader, said encapsulant only constrained at an interface with said solid state light source and said substantially planar supporting surface, such that said encapsulant is capable of expanding and contracting in response to a change in temperature;
    wherein said encapsulant comprises a curved external surface and substantially straight surface which is inwardly angled with respect to said substantially planar supporting surface, said curved external surface adjacent to said substantially straight surface, said inwardly angled encapsulant surface both refracting and reflecting light emitted by said light source.

2. The emitter of claim 1, wherein a surface of said light source is adjacent to said supporting surface, said encapsulant covering all other surfaces of said light source.

3. The emitter of claim 1, wherein said encapsulant hermetically seals said light source, said hermetic seal remaining unbroken with the change in temperature.

4. The emitter of claim 1, wherein said reflective layer is reflective to the light emitted by said light source.

5. The emitter of claim 1, wherein said light source comprises a light emitting diode.

6. A light emitter, comprising:
a heat spreader comprising a substantially planar reflective top surface comprising a discontinuity;
a solid-state light source on said reflective top surface, with said heat spreader providing support for said light source and drawing heat away from said light source;
an encapsulant positioned to surround said light source, said encapsulant only constrained in the areas around said light source by adhesion to said heat spreader and the surfaces of said light source, such that said encapsulant is capable of expanding and contracting in response to a change in temperature;
wherein said encapsulant comprises a curved external surface and a substantially straight surface which is inwardly angled with respect to said substantially planar reflective top source, said curved external surface adjacent to said substantially straight surface, said inwardly angled encapsulant surface both refracting light emitted by said light source.

7. The emitter of claim 6, wherein said reflective top surface comprises a reflective layer comprising at least one of silver (Ag), aluminum (Al), or a combination thereof.

8. The emitter of claim 6, wherein said heat spreader comprises at least one of copper (Cu), aluminum (Al), aluminum nitride (AlN), aluminum oxide (AlO), silicon (Si), silicon carbide (SiC) and another thermally conductivity material which can dissipate heat away from said light source.

9. The emitter of claim 6, wherein the surface of said heat spreader comprises at least one of aluminum (Al), silver (Ag), and another material reflective at the wavelengths of interest.

10. The emitter of claim 6, wherein said encapsulant surrounds said light source and is directly on said light source.

11. The light emitter of claim 6, wherein said encapsulant is pre-molded lens and is directly on said light source.

12. The emitter of claim 1, wherein said encapsulant is on a top surface of said substantially planar supporting surface.

13. The light emitter of claim 1, wherein an edge of said encapsulant is inwardly angled at a point of intersection with said substantially planar top surface of said reflective layer.

14. The light emitter of claim 6, wherein edge of said encapsulant is inwardly angled at a point of intersection with said reflective top surface.

15. A light emitter, comprising:
a supporting surface comprising a heat spreader and a reflective layer, said reflective layer on said heat spreader;
a light source on said reflective layer; and
an encapsulant on said supporting surface and surrounding said light source, said encapsulant only constrained at an interface with said light source and said supporting surface;
wherein said encapsulant comprises a curved external surface and a substantially straight surface which is inwardly angled with respect to said supporting surface such that at least some light emitted by said light source is transmitted through said surface, said curved external surface adjacent to said substantially straight surface.

* * * * *

UNITED STATES PATENT AND TRADEMARK OFFICE
CERTIFICATE OF CORRECTION

PATENT NO.        : 9,666,772 B2
APPLICATION NO.   : 10/836743
DATED             : May 30, 2017
INVENTOR(S)       : James Ibbetson Page 1 of 1

It is certified that error appears in the above-identified patent and that said Letters Patent is hereby corrected as shown below:

In the Claims

- Column 8, Line 64, after "surface and" please add [[a]]

- Column 9, Line 19, after "an encapsulant" please delete "positioned to surround" and add [[surrounding]]

Signed and Sealed this
First Day of August, 2017

Joseph Matal
*Performing the Functions and Duties of the*
*Under Secretary of Commerce for Intellectual Property and*
*Director of the United States Patent and Trademark Office*